United States Patent [19]

Soclof

[11] Patent Number: 4,473,834

[45] Date of Patent: Sep. 25, 1984

[54] LIGHT EMITTING TRANSISTOR ARRAY

[75] Inventor: Sidney I. Soclof, San Gabriel, Calif.

[73] Assignee: Rockwell International Corporation, El Segundo, Calif.

[21] Appl. No.: 369,858

[22] Filed: Apr. 19, 1982

[51] Int. Cl.³ ............... H01L 33/00; H01L 27/14; H01L 31/00

[52] U.S. Cl. .................... 357/17; 357/30; 357/32; 357/55; 313/499; 313/500

[58] Field of Search ............ 357/30, 55, 17, 31, 357/32; 313/499, 500; 250/370

[56] References Cited

U.S. PATENT DOCUMENTS

| | | | |
|---|---|---|---|
| 3,270,235 | 12/1961 | Loebner | 313/500 |
| 3,319,068 | 5/1967 | Beale et al. | 357/17 |
| 3,355,636 | 11/1967 | Becke | 357/55 |
| 3,411,952 | 11/1968 | Ross et al. | 357/32 |
| 3,508,111 | 4/1970 | Davidson et al. | 313/500 |
| 3,774,086 | 11/1973 | Vincent | 313/501 |

*Primary Examiner*—Martin H. Edlow
*Assistant Examiner*—Jerome Jackson, Jr.

*Attorney, Agent, or Firm*—H. Fredrick Hamann; Daniel R. McGlynn; James F. Kirk

[57] ABSTRACT

A light emitting bipolar transistor, adapted to produce light from cathodoluminescence, upon being biased into conduction, the light emitting bipolar transistor being formed on the top surface of a relatively flat semiconductor substrate and having active regions comprising: a collector region, and an emitter region, the collector and emitter regions being of a first conductivity type, and an extended base region of a second conductivity type, the extended base region being interposed between the collector and the emitter regions, and the base region having a coatable surface, a phosphor coating, the phosphor coating covering the base region coatable surface, and respective connections to the collector emitter and base regions; whereby, biasing the transistor into conduction produces an electric field in the base region, the electric field in the base field inducing electrons in the base region to increase energy to a high energy level and to drift, some drifting high energy electrons being scattered into the phosphor coating, thereby impacting the phosphor and producing light by cathodoluminescence.

11 Claims, 23 Drawing Figures

LIGHT EMITTING TRANSISTOR ARRAY

BACKGROUND OF THE INVENTION

1. Field of the Invention

This invention relates to the field of semiconductor devices and particularly to a semiconductor device structure and method for forming a light emitting transistor particularly suited to silicon process integrated circuits and related semiconductor components.

The invention light emitting transistor is of particular use when coupled through a light transmissive medium to a light sensitive receiving element such as a photo diode or photo transistor for coupling signal information free of disturbance from electromagnetic noise sources.

A principal advantage of the invention light emitting transistor is that it can be fabricated as elements in an array of silicon bipolar transistors.

2. Description of the Prior Art

Presently known light emitting diodes are made out of III-V compound semiconductor materials such as the binary compound GaAs and the ternary compound GaAlAs. The use of these materials prevent the compatible integration of these devices on silicon process integrated circuit chips. Light-detecting devices such as photodiodes and phototransistors can be processed on the same silicon chip as other signal processing and amplifying devices. The availability of a silicon compatible bipolar light emitting transistor when combined with available fiber optic or other compatible light coupling medium means provides a signal coupling means from a first integrated circuit to a second integrated circuit free of interference from electromagnetic or other radio frequency disturbances.

SUMMARY OF THE INVENTION

It is a major objective of this invention to provide a light emitting transistor and a method for forming the invention light emitting transistor.

It is a further object of this invention to provide a light emitting transistor structure compatible with silicon process integrated circuit manufacturing methods. It is a particular object of this invention to provide a light emitting transistor structure adapted to modulate the intensity of light produced by controlling a relatively low power base drive control signal.

It is a highly particular object of this invention to provide a light emitting bipolar transistor structure suitable for fabrication in predetermined arrays on a silicon substrate and having relatively high collector to emitter breakdown voltage.

These and other objectives of the invention are realized in accordance with a light emitting bipolar transistor, adapted to produce light from cathodoluminescence, upon being biased into conduction, the light emitting bipolar transistor being formed on the top surface of a relatively flat semiconductor substrate and having active regions comprising: a collector region, and an emitter region, the collector and emitter regions being of a first conductivity type, such as N+, and an extended base region of a second conductivity type, such as P. The base region is interposed between the collector and emitter regions, and the base region has a coatable top surface, a phosphor coating, the phosphor covering the base region coatable surface, and respective connections to the collector, emitter and base regions, whereby biasing the transistor into conduction produces an electric field in the base region, the electric field in the base region inducing electrons in the base region and to increase in energy to a high energy level, some drifting high energy electrons being scattered into the phosphor coating thereby impacting the phosphor and producing light by cathodoluminescence.

In the preferred embodiment of the light emitting transistor, the bipolar transistor is formed as a silicon transistor.

In an alternative preferred embodiment, the light emitting bipolar transistor, having a relatively low collector to emitter punchthrough breakdown voltage, further comprises a shortened base region of semiconductor of a second conductivity type, such as P+, the shortened base region being interposed between the extended base region and the emitter region, the shortened base region being heavily doped in relation to the extended base region; whereby the shortened base region operates to increase the collector to emitter punchthrough breakdown voltage.

In an alternative preferred embodiment, a plurality of light emitting bipolar transistors are formed on the top surface of the relatively flat semiconductor substrate, each respective light emitting bipolar transistor being as defined supra.

In yet another alternative preferred embodiment, the light emitting bipolar transistor further comprises: a plurality of perimeter defining channels, the perimeter defining channels isolating the light emitting bipolar transistor active regions, the perimeter defining channels having relatively perpendicular walls, the walls exposing and forming coatable perpendicular base region surfaces, the phosphor coating covering the base region coatable top surface being extended to cover the perpendicular coatable base region surfaces; whereby, the coated base region surface is enlarged thereby increasing the light producing efficiency of the invention light emitting bipolar transistor.

In another alternative embodiment of the light emitting transistor, the perimeter defining channels are formed by pairs of intersecting slots, the pairs of intersecting slots being formed in the top surface of the relatively flat semiconductor substrate to isolate the light emitting transistor active regions from contact with adjacent active regions.

In a more particular alternative embodiment, the light emitting transistor further comprises a plurality of light emitting bipolar transistors formed on the top surface of the relatively flat semiconductor substrate, each respective light emitting bipolar transistor being as defined above, the perimeter defining channels being formed by pairs of intersecting slots, the intersecting slots being adapted to isolate each respective light emitting bipolar transistor active region formed on the top surface of the relatively flat semiconductor substrate from contact with adjacent active regions.

In another more particular alternative embodiment of the light emitting transistor, each respective active region comprising a light emitting bipolar transistor, is substantially rectangular having a length of ten d and a width of +d where d is 1 to 10 micrometer, and the pairs of intersecting slots are effected by ion milling or by orientation dependent etching. A preferred method for forming an array of the light emitting bipolar transistors, each respective transistor being adapted to produce light from cathodoluminescence, upon being biased into conduction, each respective light emitting bipolar transistor being formed on the top surface of a relatively flat silicon substrate of a relatively lightly doped first conductivity type, wherein the array of light emitting bipolar transistors are formed comprising the following steps (a) masking the top surface of the silicon substrate to provide, at predetermined locations, first aperture patterns for forming a first set of parallel perimeter defining channels, (b) etching the first set of parallel perimeter defining channels through the first aperture patterns, the first set of parallel perimeter defining channels having opposing walls substantially perpendicular to the top surface, (c) doping the silicon substrate through the exposed opposing walls of the first set of parallel perimeter defining channels to form a first set of opposing lateral regions having a relatively heavy dopant concentration of a first conductivity type, (d) masking the top surface of the silicon substrate to provide, at predetermined locations, second aperture patterns for forming a second set of parallel perimeter defining channels, the second aperture patterns being parallel to and interposed between the first set of parallel perimeter defining channels, (e) etching the second set of parallel perimeter defining channels through the second aperture patterns, the second set of parallel perimeter defining channels having opposing walls substantially perpendicular to the top surface, said opposing walls being adapted to form a boundary for opposing transistor collector regions, (f) masking the top surface of the silicon substrate to provide a third aperture pattern, the third aperture pattern being adapted to expose the first and second sets of parallel perimeter defining channels and the respective opposing walls, (g) doping through the third aperture pattern the first and second sets of parallel perimeter defining channels respective opposing walls to form a set of opposing lateral regions having a relatively heavy dopant concentration of a second conductivity type, said doping being adapted to partially convert said first set of opposing lateral regions from a relatively heavily doped first conductivity type to a relatively heavily doped second conductivity type, said converted first set of opposing lateral regions of a relatively heavily doped second conductivity type forming emitter regions. The unconverted first set of opposing lateral regions of a relatively heavily doped first conductivity type formed shortened base regions, and the second set of opposing lateral regions of a second conductivity type form collector regions. The semiconductor substrate region of a first conductivity type positioned between the shortened base region and the respective collector regions are adapted to form extended base regions. Step (h) follows including:

(h) masking the top surface of the silicon substrate to provide parallel aperture patterns transverse to the first and second set of perimeter defining channels, (i) etching the silicon substrate to provide a third set of transverse perimeter defining channels through the transverse aperture patterns, (j) removing the mask, coating the top surface and filling the first, second and transverse of perimeter defining channels with a phosphor coating adapted to produce light by cathodoluminescence, (k) masking, metallizing and patterning the top surface to provide electrical connections to the emitter, shortened base, and collector regions.

In a more particular embodiment the top surface of the silicon substrate is selected to have a 110 crystallographic orientation, and the first and second sets of parallel perimeter defining channels and the transverse sets of perimeter defining channels are orientated to be coparallel with the silicon substrate 111 crystallographic orientation, the first set of parallel perimeter defining channels being etched using orientation dependent etching. In another more particular embodiment of the previous method, the second set of parallel perimeter defining channels and the transverse set of perimeter defining channels are etched using orientation dependent etching.

In another alternative method to the foregoing method, subsequent to step (c) the step of (c)-1 is added to include:

(c)-1 doping the silicon substrate through the exposed opposing walls of the first set of parallel perimeter defining channels to form a first set of opposing lateral regions having a relatively heavy dopant concentration of a second conductivity type, the doping being adapted to partially convert the first set of opposing lateral regions to a relatively heavily doped second conductivity type, the converted first set of opposing lateral regions of a relatively heavily doped second conductivity type forming emitter regions. The unconverted first set of lateral regions of a relatively heavily doped first conductivity type form shortened base regions. This alternative method continues with completing steps (d) and (e) and deleting step (f) and substituting step (g)-1 for step (g), step (g)-1 to include:

(g)-1 doping through the second aperture pattern the second set of perimeter defining channels respective opposing walls to form a second set of opposing lateral regions having a relatively heavy dopant concentration of a second conductivity type, the second set of opposing lateral regions of a second conductivity type forming opposing collector regions. The semiconductor substrate region of a relatively lightly doped first conductivity type positioned between each respective shortened base region and corresponding collector region, is adapted to form an extended base region. This alternative method concludes by completing steps (h), (i) (j), and (k).

In a more particular embodiment of the foregoing alternative embodiment, the first conductivity type material is doped P and the second conductivity type material is doped N.

In an even more particular embodiment, the relatively flat silicon substrate of a relatively lightly doped first conductivity type, is formed on a dielectric layer, and the first and second parallel perimeter defining channels are etched using orientation dependent etching through the relatively flat silicon semiconductor substrate to the dielectric layer.

In yet another alternative method for forming an array of light emitting bipolar transistors the following steps are included:

(a) masking the top surface of the silicon substrate to provide, at predetermined locations, first aperture patterns for forming a first set of parallel perimeter defining channels, (b) etching the first set of parallel perimeter defining channels through the first aperture patterns, the first set of parallel perimeter defining channels having opposing walls substantially perpendicular to the top surface, (c) masking the top surface of the silicon substrate to provide widened first apertures, the widened first apertures being adapted to expose the first set of parallel perimeter defining channels and respective first set of parallel perimeter defining channel adjacent top surface areas, (d) doping the first set of parallel perimeter defining channel adjacent top surface areas and respective exposed opposing walls, the doping forming a first set of opposing lateral regions having a relatively heavy dopant concentration of a first conductivity type, (e) masking the top surface of the silicon substrate to provide, at predetermined locations, second aperture patterns parallel to and interposed between the first set of parallel perimeter defining channels for forming a second set of parallel perimeter defining channels, (f) etching the second set of parallel perimeter defining channels through the second aperture patterns, the second set of parallel perimeter defining channels having opposing walls substantially perpendicular to the top surface, (g) masking the top surface of the silicon substrate to provide a third aperture pattern, the third aperture pattern being adapted to expose the first and second sets of parallel perimeter defining channels, respective opposing walls and top surface narrow areas adjacent to each respective parallel perimeter defining channel, (h) doping through the third aperture pattern and through the first and second sets of parallel perimeter defining channels respectivt opposing walls and through the top surface narrow areas to form a set of opposing narrow lateral regions having a relatively heavy dopant concentration of a second conductivity type. The doping is adapted to partially convert the first set of opposing lateral regions from a relatively heavily doped first conductivity type to a relatively heavily doped second conductivity type material. The converted first set of opposing lateral regions of a relatively heavily doped second conductivity type form emitter regions. The unconverted first set of opposing lateral regions of a relatively heavily doped first conductivity type form shortened base regions. The second set of opposing lateral regions having a relatively heavy dopant concentration of a second conductivity type form collector regions. The semiconductor substrate region of a relatively lightly doped first conductivity type positioned between respective shortened base and collector regions is adapted to form extended base regions. This alternative method continues with the steps of:

(i) masking the top surface of the silicon substrate to provide parallel aperture patterns transverse to the first and second sets of perimeter defining channels, (j) etching the silicon substrate to provide a set of transverse perimeter defining channels through the transverse aperture patterns, (k) removing the mask, coating the top surface and filling the first, second and transverse sets of perimeter defining channels with a phosphor coating adapted to produce light by cathodoluminescence, followed by masking, metallizing and patterning the top surface to provide electrical connections to the emitter, shortened base, and collector regions.

In a more particular embodiment of the foregoing alternative embodiment, the top surface of the silicon substrate is selected to have a 110 crystallographic orientation, and the first aperture patterns are orientated to be coparallel with the silicon substrate 111 crystallographic orientation, the first set of parallel perimeter defining channels are etched using orientation dependent etching.

In another even more particular embodiment of the foregoing alternative embodiment, the second aperture pattern is etched using orientation dependent etching, and the set of transverse perimeter defining channels are etched using orientation dependent etching, and the first conductivity type material is doped P and the second conductivity type material is doped N. In yet another even more particular embodiment of the foregoing alternative embodiment, the relatively flat silicon semiconductor substrate of a relatively lightly doped first conductivity type is formed on a dielectric layer, and the first and second parallel perimeter defining channels and the transverse perimeter defining channels are etched through the relatively flat silicon semiconductor substrate to the dielectric layer.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

Figure 1:
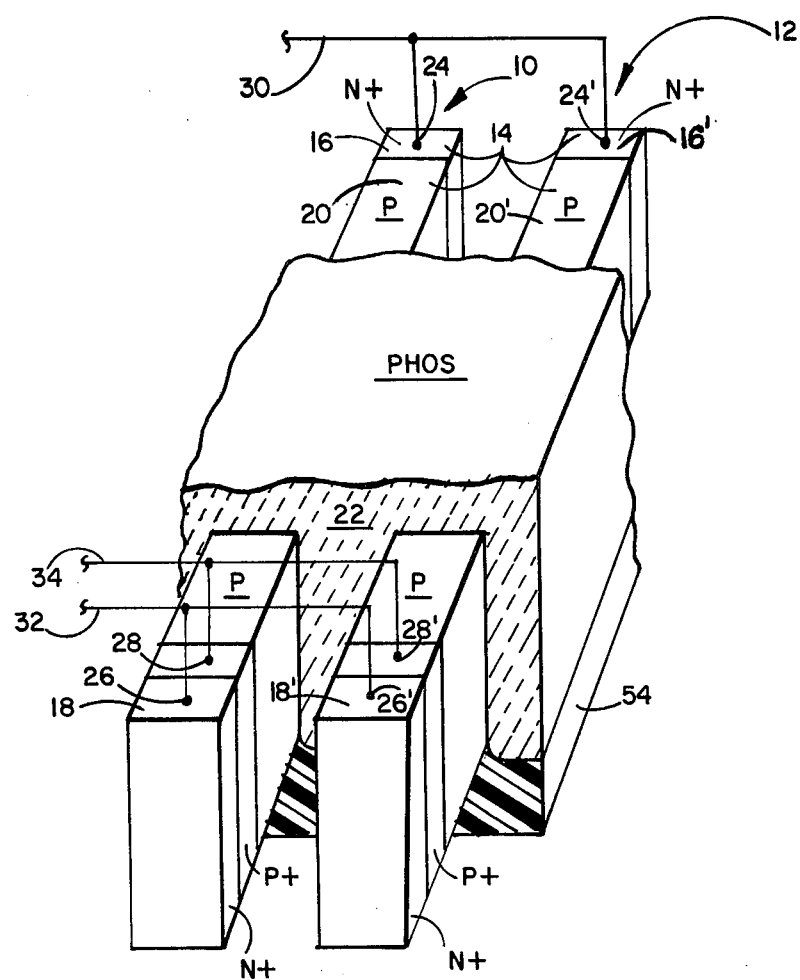
FIG. 1 is a perspective view of the light emitting transistor depicting the transistor structure extending from a sectioned substrate and phosphor coating.

Referring now to FIG. 1 there is shown a sectioned perspective view of two adjacent light emitting bipolar transistors 10, 12 adapted to produce light from cathodoluminescence, upon being biased into conduction, the light emitting bipolar transistors being formed on the top surface of a relatively flat semiconductor substrate and having active regions comprising: a collector region 16, 16' and an emitter region 18, 18', the collector and emitter regions being of a first conductivity type, such as N+, and an extended base region 20, 20' of a second conductivity type, such as P, the extended base region 20, 20' being interposed between the collector 16, 16' and the emitter regions 18, 18'. The base region has a coatable top surface 14. A phosphor coating 22 is depicted covering the base region coatable surface 14. Respective connections to the collector 24, 24', emitter 26, 26' and base 28, 28' regions are shown. Biasing the transistor into conduction, for example by biasing the collector terminal 30 positive with respect to the emitter terminal 32 and by biasing the base terminal 34 positive with respect to the emitter terminal 32, will produce an electric field in the base region 20. The electric field in the base region 20 induces electrons in the base region 20 to increase in energy to a high energy level and to drift from the emitter region 18 through the base region 20 to the collector region 16. Some drifting high energy electrons are scattered into the phosphor coating 22, thereby impacting the phosphor and producing light by cathodoluminescence.

Figure 2:
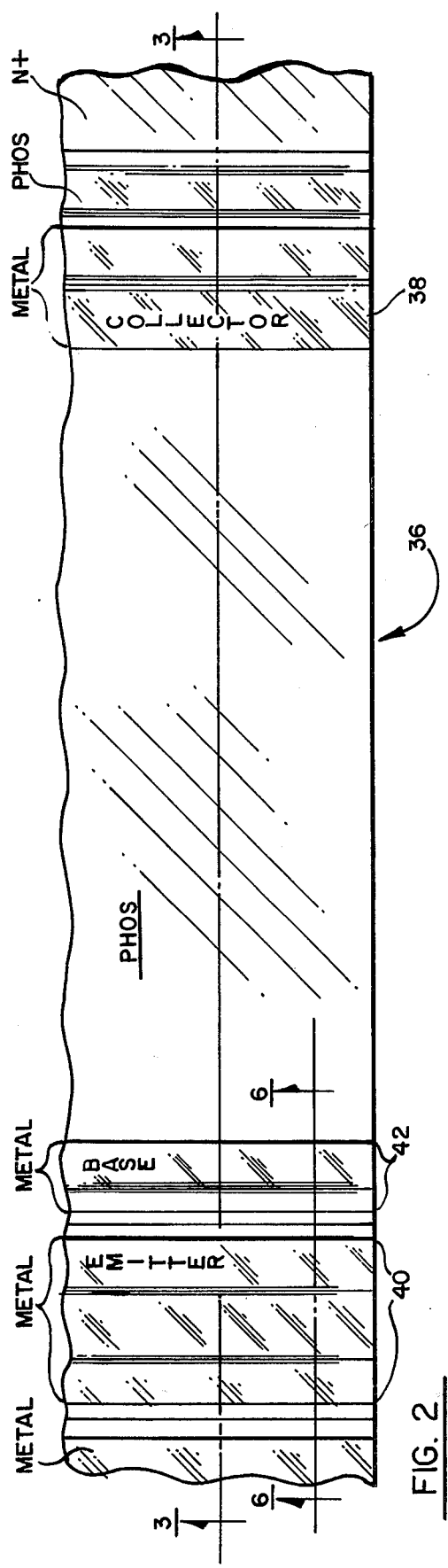
FIG. 2 is a plan view of the light emitting transistor.

FIG. 2 shows a plan view of the top surface of the light emitting bipolar transistor 36 provided with respective connections 38, 40, 42 to the collector, emitter and base regions. These are formed by masking, metallizing and patterning the top surface to provide the required electrical connections to each of the respective N+ and P+ regions.

Figure 3:
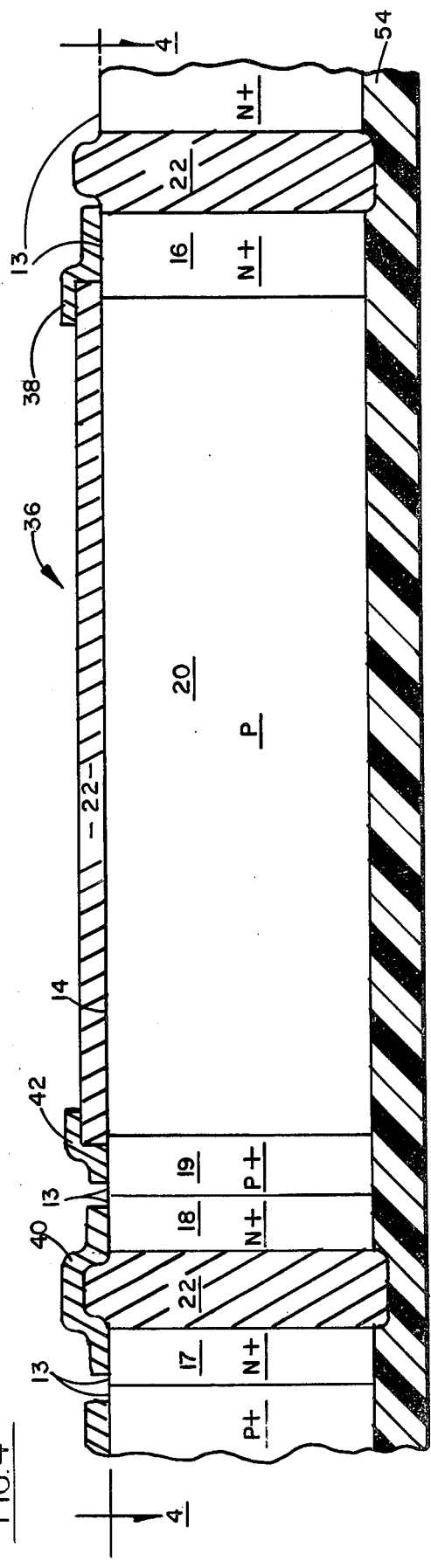
FIG. 3 is a sectional side view along line 3—3 depicting the extended base region P.

Referring to FIG. 3, a side sectional view along line 3—3 depicting the extended base region 20 doped P, wherein the light emitting bipolar transistor 36, having a relatively low collector to emitter punchthrough breakdown voltage, further comprises a shortened base region 19 of semiconductor material such as silicon, of a second conductivity type, for example P+. The shortened base region 19 is interposed between the extended base region 20 and the emitter region 18, the shortened base region 19 being heavily doped, for example P+, in relation to the extended base region 20 being doped P; whereby, the shortened base region 19 operates to increase the collector to emitter breakdown voltage. Respective connections 38, 40, 42 of metal to collector, emitter and base regions respectively are also shown. Phosphor coating 22 is depicted covering the base region coatable surface 14 and is also depicted filling a void between adjacent emitters 17 and 18 and another void between adjacent collectors 15 and 16. The base region coatable surface 14 is formed on the top surface 13 of the relatively flat semiconductor substrate.

Figure 4:
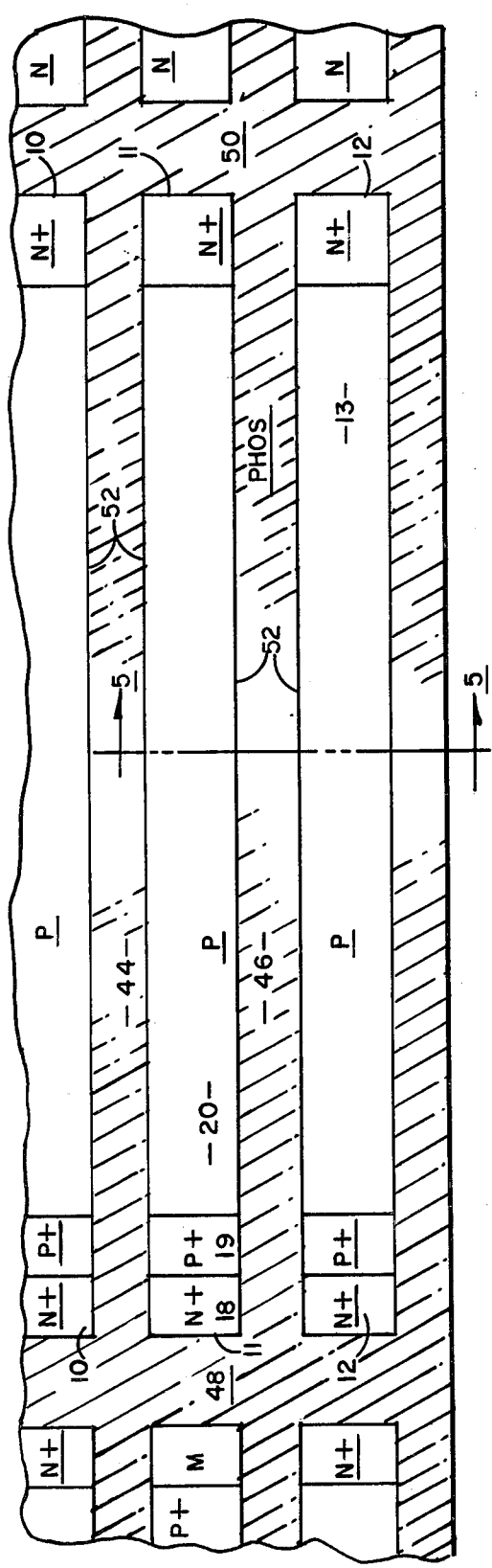
FIG. 4 is sectional plan view along line 4—4 depicting the light emitting transistor structure at a level immediately beneath the metallization and phosphor coating.

Referring to FIG. 4, a sectional plan view along line 4—4 depicts a plurality of light emitting bipolar transistor active regions 10, 11, 12 formed on the top surface 13 of the relatively flat semiconductor substrate. A plurality of perimeter defining channels 44, 46, 48, 50 isolate the light emitting bipolar transistor active regions 10, 11, 12. The perimeter defining channels have walls, the walls are relatively perpendicular to the top surface 13, and when exposed form perpendicular coatable base region surfaces 52. The coatable base region surface 14 is enlarged by the perpendicular coatable base region surfaces 52 thereby increasing the light producing efficiency of the invention light emitting bipolar transistors 10, 11, 12. Collector region 16, emitter region 18 extended base region 20 and shortened base region 19 are also depicted.

Figure 5:
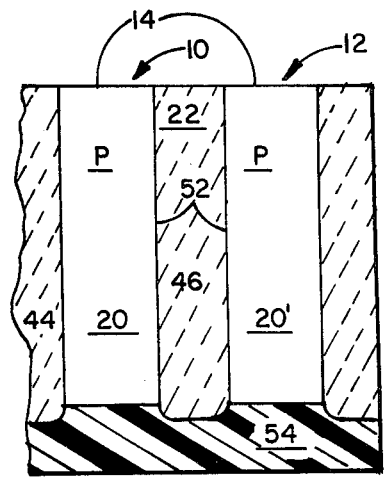
FIG. 5 is a sectional view along line 5—5 depicting the phosphor coating on top of and between the extended base regions of several light emitting transistor structures.

FIG. 5 is a sectional view along line 5—5 of FIG. 4 illustrating the plurality of perimeter defining channels 44, 46 isolating the light emitting bipolar transistor active regions 10, 11, the perimeter defining channels 44, 46 having walls, the walls being relatively perpendicular to the top surface and being exposed by the perimeter defining channels, the walls forming perpendicular coatable base region surfaces 52, the phosphor coating 22 (not shown) covering the base region coatable surface 14 being extended to cover the perpendicular coatable base region surfaces 52; whereby the coatable base region surface 14 is enlarged thereby increasing the light producing efficiency of the invention light emitting bipolar transistors. The cross-section of the extended base region 20, doped P, is surrounded by phosphor coating 22 extending into a dielectric layer 54 of silicon or silicon dioxide or sapphire.

Figure 6:
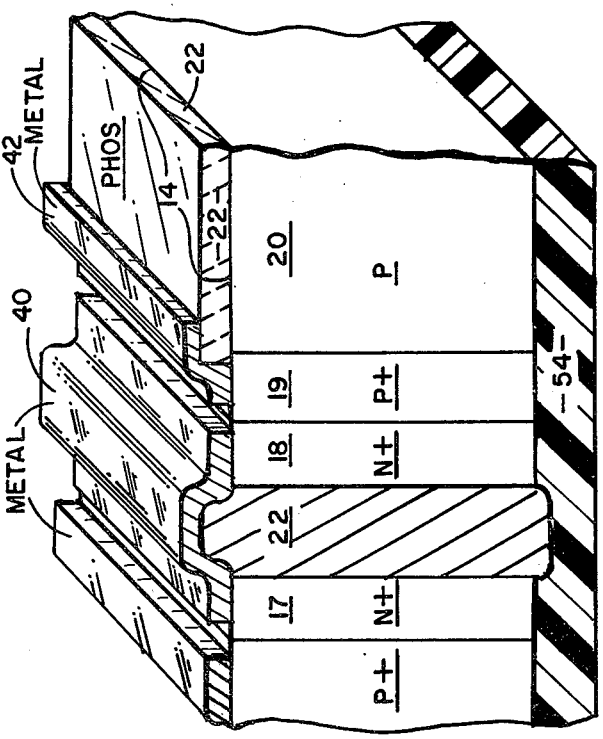
FIG. 6 is a perspective sectional view along line 6—6 depicting metallization contacts with N+ emitter regions and P+ base regions.

FIG. 6 is a perspective view depicting patterned metallization forming emitter connection 40 covering perimeter defining channel 48 filled with phosphor coating 22, and base connection 42, contacting shortened base region 19. Adjacent emitter regions 17, 18 are connected by emitter connection 40. Dielectric layer 54 supports the adjacent emitter regions 17, 18 and the shortened base region 19 and extended base region 20. Coatable base region surface 14 is coated with phosphor coating 22. Referring again to FIG. 4, the perimeter defining channels 44, 46, 48 and 50 are formed by pairs of intersecting slots, for example straight slots obtained by ion milling or by orientation dependent etching having a substantial depth to width ratio, for example in excess of 100 to 1. Although perimeter defining channels such as 44 and 46 are shown as being relatively perpendicular to perimeter defining channels 48 and 50, it is understood that intersecting angles other than ninety degrees, such as approximately 70.5 degrees, as will occur by using orientation dependent etching.

Combinations of known etching methods are also envisioned. For example, the perimeter defining channels 48 and 50 may be first etched using ion milling followed by forming the perimeter defining channels 44 and 46 by using orientation dependent etching.

The phosphor coating 22 covering the base region coatable surface 14 is selected to have applicable luminance, writing speed and color for the application intended as described in the Tektronix "Circuit Concepts, volumn on cathode-ray tubes by C. DeVere", FIG. 13-1, page 74. The properties of phosphors are also discussed at some length in the "Television Engineering Handbook" by Fink, McGraw-Hill, on pages 5-16 through 5-51.

Figure 7A:
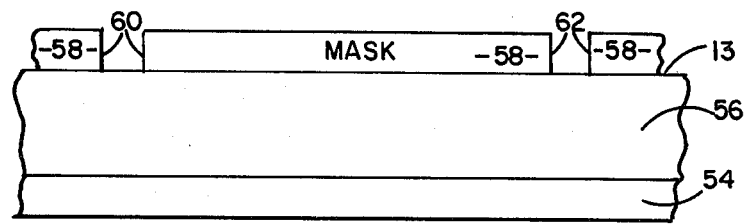
FIG. 7A through 7K and 8A to 8F are cross-sectional views illustrating the various steps of the method of the present invention.

FIG. 7A through 7J depict a method for forming an array of light emitting bipolar transistors. FIG. 7A shows the top surface 13 of a relatively flat semiconductor substrate 56, on dielectric layer 54. The first step (a) in forming an array of light emitting bipolar transistors is shown comprising masking the top surface of the silicon substrate 56 with mask 58 to provide, at predetermined locations, first aperture patterns, such as aperture 60 and 62, for forming a first set of parallel perimeter defining channels.

Figure 7B:
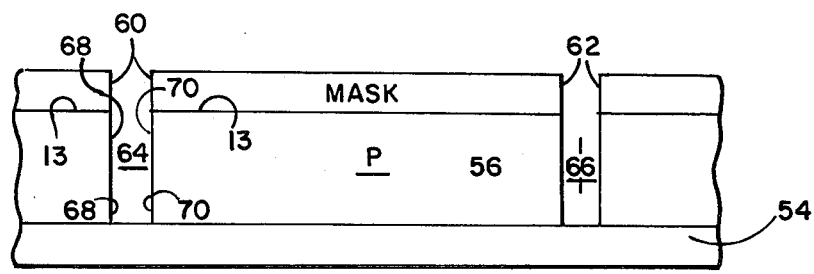

FIG. 7B shows the second step, (b) of etching the first set of parallel perimeter defining channels 64, 66 through the first aperture patterns 60, 62, the first set of parallel perimeter defining channels 64, 66 having opposing walls 68, 70 substantially perpendicular to the top surface 13.

Figure 8A:
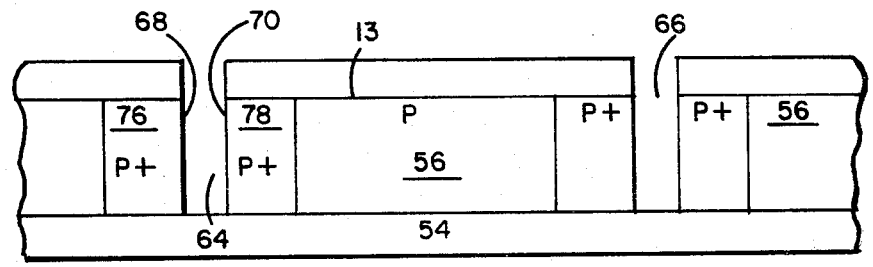

FIG. 8A shows step (c) of doping the silicon substrate 56 through the exposed opposing walls 68, 70 of the first set of parallel perimeter defining channels 64, 66 to form a first set of opposing lateral regions having a relatively heavy dopant concentration of a first conductivity type such as P+.

Figure 8B:
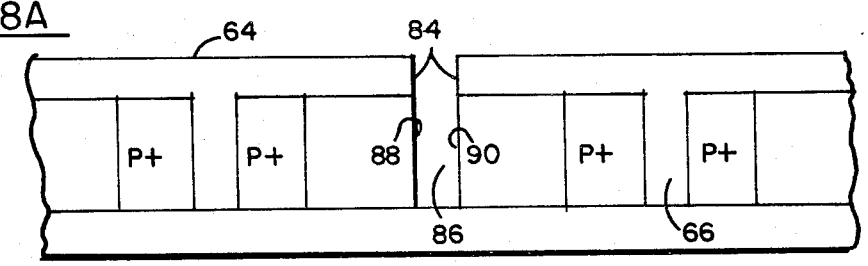

FIG. 8B depicts step (d) of masking the top surface 13 of the silicon substrate to provide, at predetermined locations, second aperture patterns 84 for forming a second set of parallel perimeter defining channels, the second aperture patterns 84 being parallel to and interposed between the first set of parallel perimeter defining channels 64, 66. FIG. 8B also depicst step (e) of etching the second set of parallel perimeter defining channels 86 through the second aperture patterns 84, the second set of parallel perimeter defining channels 86 having opposing walls 88, 90 substantially perpendicular to the top surface 13, the opposing walls being adapted to form a boundary for opposing transistor collector regions.

Figure 8C:
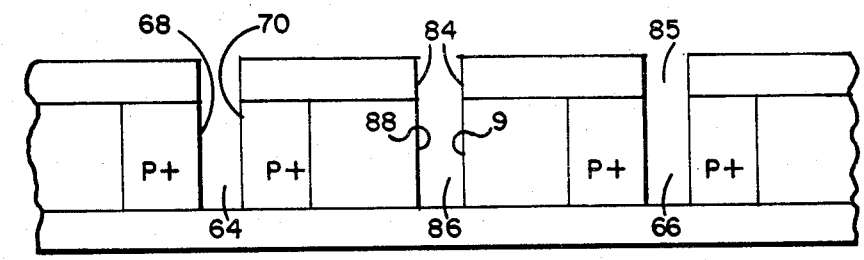

FIG. 8C shows step (f) including masking the top surface of the silicon substrate to provide a third aperture pattern 85 the third aperture pattern being adapted to expose the first set of parallel perimeter defining channels 64, 66 and the second set of parallel perimeter defining channels 86 and their respective opposing walls 68, 70 and 88, 90.

Figure 8D:
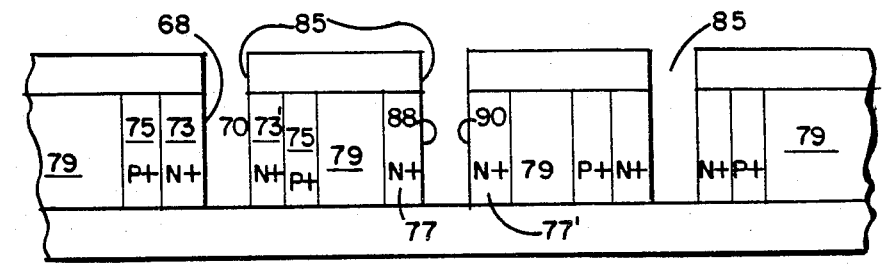

FIG. 8D depicts step (g) of doping through the third aperture pattern 85 the first and second sets of parallel perimeter defining channels respective opposing walls 68, 70 and 88, 90 to form a set of opposing lateral regions 73, 73'; 77, 77' having a relatively heavy dopant concentration of a second conductivity type, such as N+, the doping being adapted to partially convert the first set of opposing lateral regions from a relatively heavily doped first conductivity type to a relatively heavily doped second conductivity type. The converted first set of opposing lateral regions 73, 73' of a relatively heavily doped second conductivity type form emitter regions. The unconverted first set of opposing lateral regions 75, 75' of a second conductivity type form shortened base regions. The second set of opposing lateral regions 77, 77' of a second conductivity type form collector regions The semiconductor substrate regions of a first conductivity type positioned between shortened base regions, such as 75', and respective collector regions, such as 77, being adapted to form extended base regions, such as 79.

Figure 7C:
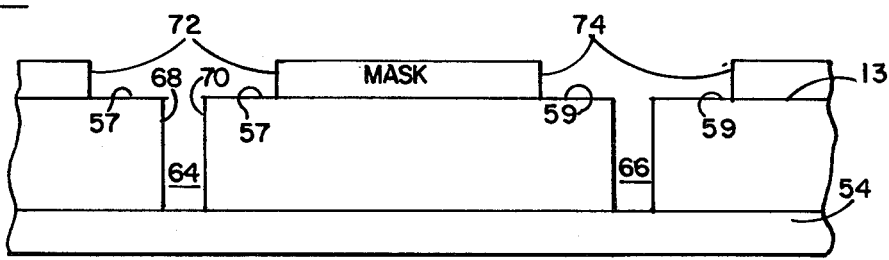
Figure 7D:
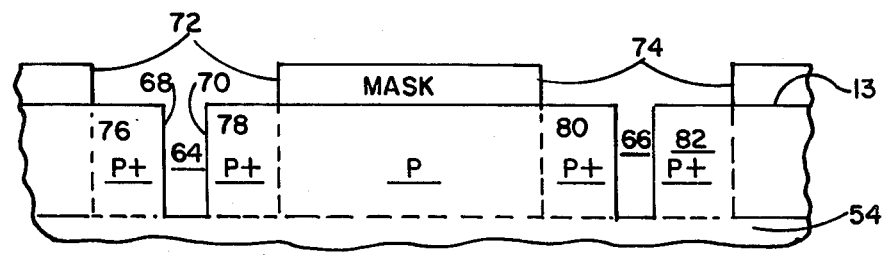
Figure 7E:
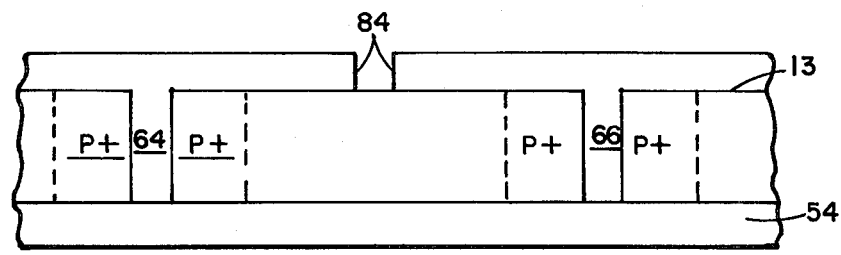
Figure 7F:
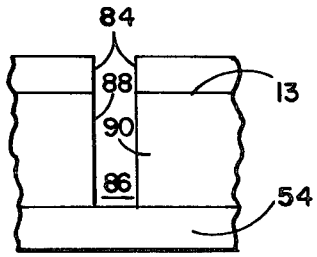
Figure 7G:
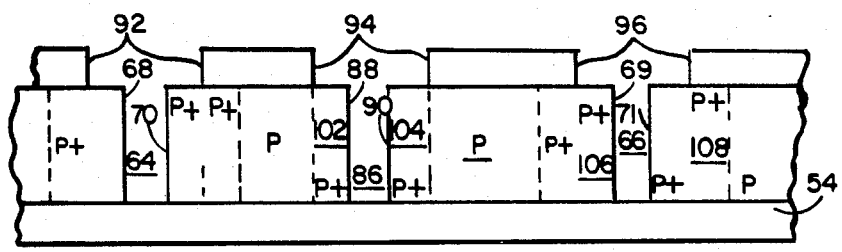
Figure 7H:
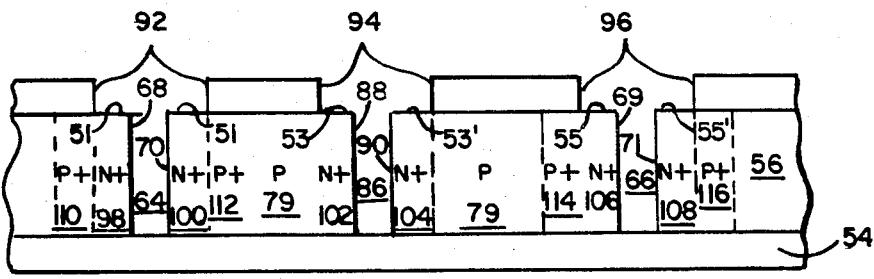
Figure 7I:
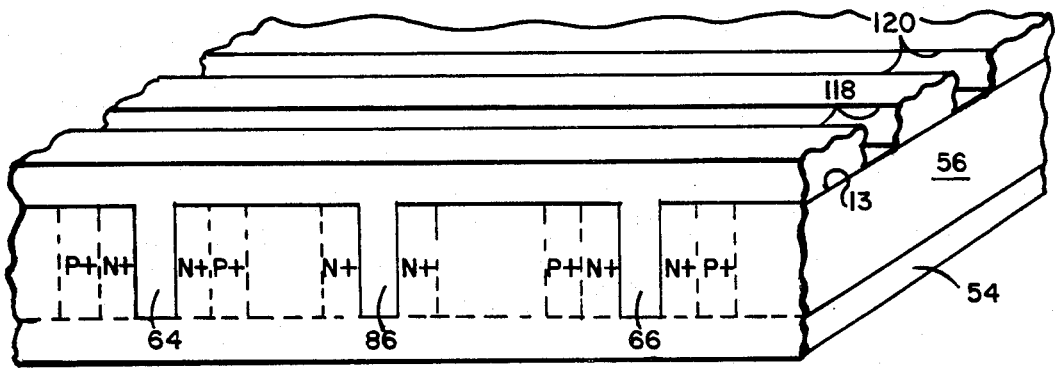

FIG. 7I depicts step (h) of masking the top surface 13 of the silicon substrate 56, to provide a parallel aperture pattern 118, 120 transverse to the first and second set of perimeter defining channels 64, 66, 86.

Figure 7J:
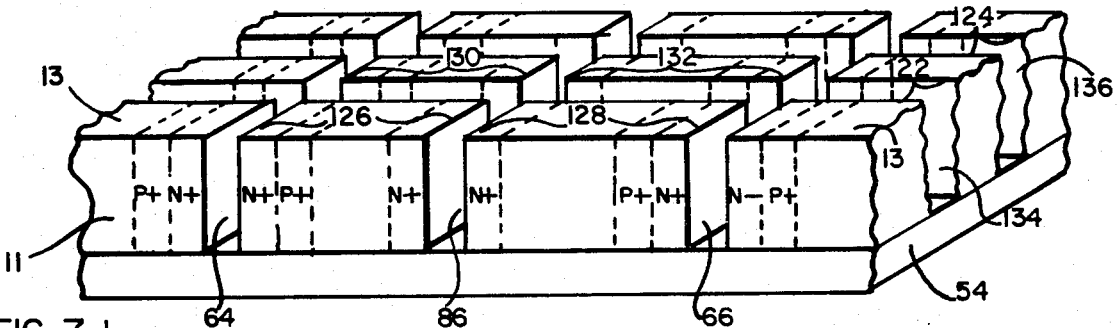

FIG. 7J depicts step (i) of etching the silicon substrate to provide a third set of transverse perimeter defining channels 134, 136 followed by step (j) including removing the mask.

Figure 7K:
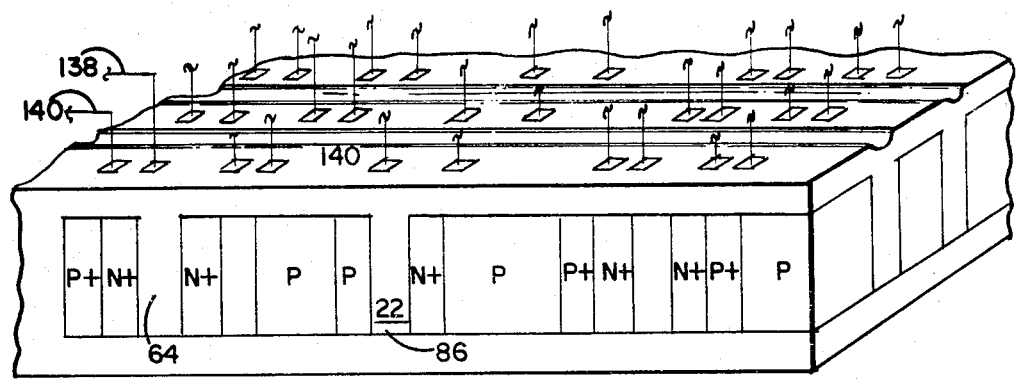

FIG. 7K depicts the result of coating the top surface and filling the first, second and transverse sets of perimeter defining channels 64, 66; 86; 134, 136 with a phosphor coating 22 adapted to produce light by cathodoluminescence, followed by the conventional step of masking, metallizing and patterning the top surface 14 to provide electrical connections to the emitters 140, 140', shortened base regions 138, 138' and collector regions 142, 142'.

Referring again to FIG. 7J the top surface 13 of the silicon substrate is selected to have a 110 crystallographic orientation. The first and second sets of parallel perimeter defining channels, such as 64 and 86, and the transverse sets of perimeter defining channels, such as 134 and 136 are orientated to be coparallel with the silicon substrate 111 crystallographic orientation, said first set of parallel perimeter defining channels 64, 66 being etched using orinetation dependent etching such as described in "Semiconductor Silicon" by S. K. Kurtz, Electrochemical Society, Princeton, N.J., pp 315–326, 1973 or in the RCA Review, Vol. 31, article by A. I. Stoller, pp 271, 1970.

Figure 8E:
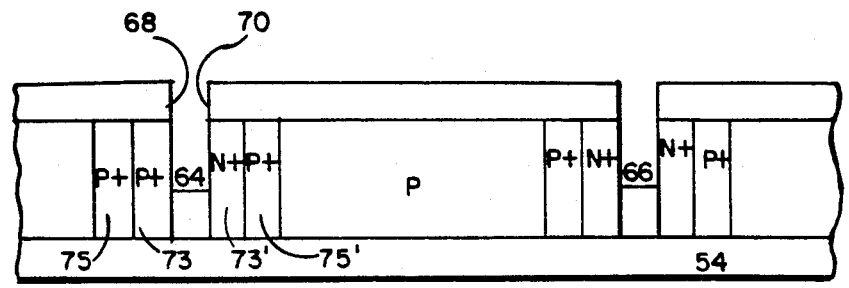

FIG. 8E depicts an alternate sequence of steps for the method invention commencing subsequent to step (c) and comprising the addition of step (c)-1 to include doping the silicon substrate of FIG. 8A through the exposed opposing walls 68, 70 of the first set of parallel perimeter defining channels 64, 66 to form a first set of opposing lateral regions 73, 73' having a relatively heavy dopant concentration of a second conductivity type, such as N+. The doping is adapted to partially convert the first set of opposing lateral regions 76, 78 to a relatively heavily doped second conductivity type. The converted first set of opposing lateral regions 73, 73' of a relatively heavily doped second conductivity type, form emitter regions for the invention light emitting transistor.

The unconverted first set of opposing lateral regions 75, 75' of a relatively heavily doped first conductivity type, such as P+, form shortened base regions.

Figure 8F:
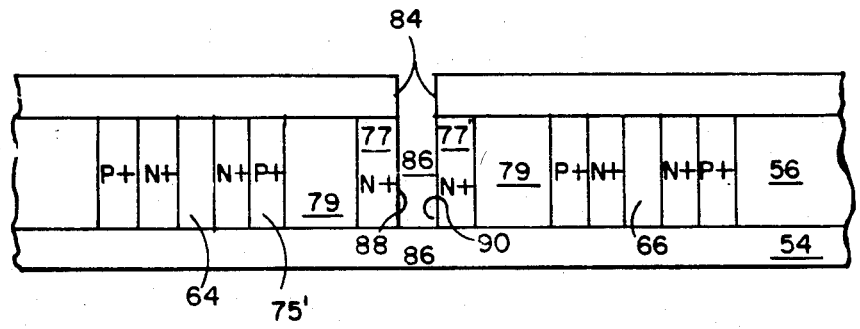

Completing steps (d) and (e), as described previously, provides a second aperture pattern 84 and a corresponding second set of parallel perimeter defining channels 86 as depicted in FIG. 8F. Step (g) is then replaced by step (g)-1 to include, doping through the second aperture 84 pattern the second set of perimeter defining channels respective opposing walls 88, 90 to form a second set of opposing lateral regions having a relatively heavy dopant concentration of a second conductivity type, such as N+, said second set of opposing lateral regions 77, 77' forming opposing collector regions.

The semiconductor substrate region of a relatively lightly doped first conductivity type positioned between each respective shortened base region, such as 75' and corresponding collector region, such as 77, is adapted for form an extended base region 79. The invention bipolar light emitting transistor is completed by completing steps (h), (i), (j) and (k) as described previously.

The alternative method described provides the advantage of a reduced number of masking steps. In each of the foregoing methods, an NPN transistor is described, however; a PNP transistor is also envisioned.

In an alternative embodiment of the method invention, the relatively flat silicon semiconductor substrate 56 of a relatively lightly doped first conductivity type, such as P, is formed on a dielectric layer 54, and the first and second parallel perimeter defining channels 64, 66; 86 are etched using orientation dependent etching through the relatively flat silicon semiconductor substrate 56 to the dielectric layer 54. Orientation dependent etching is described, however; other etching methods are also envisioned such as conventional chemical etching and ion or plasma etching methods.

FIG. 7A shows another alternative method for forming an array of light emitting bipolar transistors, each respective transistor being adapted to produce light from cathodoluminescence, upon being biased into conduction, each respective light emitting bipolar transistor being formed on the top surface 13 of a relatively flat silicon semiconductor substrate of a relatively lightly doped first conductivity type, such as P. FIG. 7A depicts step (a) of masking the top surface 13 of the silicon substrate 56 with mask 58 to provide, at predetermined locations, first aperture patterns 60, 62 for forming a first set of parallel perimeter defining channels.

FIG. 7B shows the result of etching the first set of parallel perimeter defining channels 64, 66 through the first aperture patterns 60, 62, the firs set of parallel perimeter defining channels 64, 66 having opposing walls, such as 68 and 70, substantially perpendicular to the top surface 13.

FIG. 7C shows step (c) of masking the top surface 13 of the silicon substrate to provide widened first apertures 72, 74, the widened first apertures 72, 74 being adapted to expose the first set of parallel perimeter defining channels 64, 66 and respective first set of parallel perimeter defining channel adjacent top surface areas 57, 59.

FIG. 7D shows the result of step (d), of doping the first set of parallel perimeter defining channel adjacent top surface areas 57, 59 and respective exposed opposing walls 68, 70, the doping forming a first set of opposing lateral regions 76, 78 having a relatively heavy dopant concentration of a first conductivity type, such as P+. FIG. 7E shows step (e) of masking the top surface 13 of the silicon substrate to provide, at predetermined locations, second aperture patterns, such as 84, parallel to and interposed between the first set of parallel perimeter defining channels 64, 66, for forming a second set of parallel perimeter defining channels.

FIG. 7F depicts etching the second set of parallel perimeter defining channels, such as 86, through the second aperture patterns, such as 84, the second set of parallel perimeter defining channels 86 having opposing walls 88, 90 substantially perpendicular to the top surface 13.

FIG. 7G shows the step of masking the top surface 13 of the silicon substrate to provide a third aperture pattern 92, 94, 96, the third aperture pattern being adapted to expose the first and second sets of parallel perimeter defining channels 64, 66; 86, respective opposing walls 68, 70; 69, 71; 88, 90 and top surface narrow areas 51, 53, 55 adjacent to each respective parallel perimeter defining channel.

FIG. 7H shows step (h) including doping through the third aperture pattern 92, 94, 96, and through the first and second sets of parallel perimeter defining channels respective opposing walls 68, 70; 69, 71; 88, 90 and the top surface narrow areas 51, 53, 55 to form a set of opposing narrow lateral regions 98, 100; 106, 108; 102, 104 having a relatively heavy dopant concentration of a second conductivity type, such as N+.

The doping is adapted to partially convert the first set of opposing lateral regions 76, 78; 80, 82 from a relatively heavily doped first conductivity type material, such as P+, to a relatively heavily doped second conductivity type material. The converted first set of opposing lateral regions of a relatively heavily doped second conductivity type form emitter regions for the invention light emitting transistor.

The unconverted first set of opposing lateral regions 110, 112; 114, 116; of a relatively heavily doped first conductivity type form shortened regions for the invention light emitting transistor.

The second set of opposing lateral regions 102, 104 having a relatively heavy dopant concentration of a second conductivity type form collector regions for the invention light emitting transistor.

The semiconductor substrate region of a first conductivity type positioned between respective shortened base and collector regions is adapted to form extended base regions of a relatively lightly doped first conductivity type.

FIG. 7I depicts step (i) of masking the top surface 13 of the silicon substrate 56 to provide parallel aperture patterns 118, 120 transverse to the first and second sets of perimeter defining channels 64, 66; 86.

FIG. 7J shows step (j) including etching the silicon substrate to provide a set of transverse perimeter defining channels 134, 136 through the transverse aperture patterns 118, 120.

FIG. 7J shows step (k) to include removing the mask, thereby exposing the respective first, second and transverse parallel perimeter defining channels.

FIG. 7K shows the result of filling the first, second and transverse sets of perimeter defining channels with a phosphor coating 22 adapted to produce light by cathodoluminescence, and masking, metallizing and patterning the top surface to provide electrical connections to the emitter 138, base 140, and collector 142.

In alternative embodiments, the top surface 13 of the silicon substrate is selected to have a 110 crystallographic orientation, and the first aperture patterns are orientated to be coparallel with the silicon substrate 111 crystallographic orientation, and the first, second and transverse sets of parallel perimeter defining channels are etched using orientation dependent etching, or other conventional etching techniques singly or in combination as described previously.

The silicon substrate 56 is formed on a dielectric layer 54 such as sapphire. The silicon substrate can be grown on the dielectric layer as a heteroepitaxy layer using conventional deposition methods.

The above described embodiments of this invention light emitting transistor are merely descriptive of the invention principles and are not to be considered limiting. The scope of this invention instead shall be determined from the scope of the following claims including their equivalents.

What is claimed is:

1. An array of light emitting bipolar transistors, adapted to produce light from cathodoluminescence, upon being biased into conduction, each said light emitting bipolar transistor being formed on the top surface of a relatively flat semiconductor substrate and having active regions comprising:

a collector region formed on said substrate; and
 an emitter region formed on said substrate; said collector and emitter regions being of a first conductivity type and
 an extended base region of a second conductivity type, said extended base region being formed on said substrate and interposed between said collector and emitter regions, each respective light emitting bipolar transistor being isolated from other light emitting transistors on said substrate surface by,
 a plurality of perimeter defining channels, said perimeter defining channels isolating said light emitting bipolar transistor active regions, said perimeter defining channels having
 relatively perpendicular walls, and extending in depth to said substrate, said walls exposing and forming perpendicular coatable base region surfaces;
 a phosphor coating, said phosphor coating covering said base region coatable surface, and being extended to cover said perpendicular coatable base region surfaces;
 respective connections to each said collector, emitter and base regions,
 whereby, biasing each said transistor into conduction produces an electric field in said base region, said electric field in said base region inducing electrons in said base region to increase in energy to a high energy level and to drift, some drifting high energy electrons being scattered into said phosphor coating, thereby, impacting said phosphor and producing light by cathodoluminescence and;
 whereby, said coatable base region surface is enlarged by said perimeter defining channels, thereby increasing the light producing efficiency of said invention array of light emitting bipolar transistor.

2. The combination of claim 1, wherein said semiconductor substrate is of silicon, whereby said light emitting bipolar transistor is formed as a silicon transistor.

3. The combination of claim 2, wherein said light emitting bipolar transistor, having a relatively low collector to emitter breakdown voltage, further comprises a shortened base region of semiconductor of a second conductivity type, said shortened base region being interposed between said extended base region and said emitter region, said shortened base region being heavily doped in relation to said extended base region, whereby said shortened base region operates to increase said collector to emitter breakdown voltage.

4. The combination of claim 1, wherein said perimeter defining channels are formed by pairs of intersecting slots, said pairs of intersecting slots being formed in said top surface of said relatively flat semiconductor substrate to isolate said light emitting transistor active regions from contact with adjacent active regions.

5. The combination of claim 4, further comprising a plurality of light emitting bipolar transistors formed on said top surface of said relatively flat semiconductor substrate, each respective light emitting bipolar transistor being as defined by claim 1, said perimeter defining channels being formed by pairs of intersecting slots, said intersecting slots being adapted to isolate each respective light emitting bipolar transistor active region formed on said top surface of said relatively flat semiconductor substrate from contact with adjacent active regions.

6. The combination of claim 5, wherein said semiconductor substrate is of silicon, whereby said light emitting bipolar transistors are formed as silicon transistors.

7. The combination of claim 6, wherein each respective light emitting bipolar transistor, having a relatively low collector to emitter breakdown voltage, further comprises a shortened base region of semiconductor of a second conductivity type, each respective shortened base region being interposed between said respective extended base region and said respective emitter region, each respective shortened base region being heavily doped in relation to said respective shortened base region being heavily doped in relation to said respective extended base region; whereby each respective shortened base region operates to increase said collector to emitter breakdown voltage.

8. The combination of claim 7, wherein:
each respective active region comprising a light emitting bipolar transistor, is substantially rectangular having a length of ten d and a width +d wherein d is 1.0 to 10 micrometer.

9. The combination of claim 8, wherein:
said pairs of intersecting slots are effected by ion milling.

10. The combination of claim 7, wherein:
said pairs of intersecting slots are effected by orientation dependent etching.

11. The combination of claim 10, wherein:
said semiconductor of a first conductivity type is N+, and said semiconductor of a second conductivity type is P.

* * * * *